United States Patent
Beck et al.

(10) Patent No.: US 7,973,847 B2
(45) Date of Patent: *Jul. 5, 2011

(54) CIRCUIT FOR AN ACTIVE PIXEL

(75) Inventors: Jeffery Steven Beck, Corvallis, OR (US); Matthew Michael Borg, Albany, OR (US)

(73) Assignee: Aptina Imaging Corporation, Grand Cayman (KY)

( * ) Notice: Subject to any disclaimer, the term of this patent is extended or adjusted under 35 U.S.C. 154(b) by 695 days.

This patent is subject to a terminal disclaimer.

(21) Appl. No.: 12/061,806

(22) Filed: Apr. 3, 2008

(65) Prior Publication Data

US 2008/0192136 A1    Aug. 14, 2008

Related U.S. Application Data

(63) Continuation of application No. 10/630,647, filed on Jul. 29, 2003, now Pat. No. 7,369,168.

(51) Int. Cl.
*H04N 5/335* (2011.01)
*H04N 1/04* (2006.01)
*H01L 31/113* (2006.01)
*H01L 27/00* (2006.01)

(52) U.S. Cl. ..... 348/308; 348/294; 257/291; 250/208.1; 358/482

(58) Field of Classification Search ............ 348/294, 348/308, 300–302; 257/291, 292; 250/208.1; 358/482

See application file for complete search history.

(56) References Cited

U.S. PATENT DOCUMENTS

| | | | |
|---|---|---|---|
| 5,847,381 A | 12/1998 | Isogai |
| 5,877,715 A | 3/1999 | Gowda et al. |
| 5,898,168 A | 4/1999 | Gowda et al. |
| 5,949,483 A | 9/1999 | Fossum et al. |
| 6,043,115 A | 3/2000 | Pan |
| 6,122,995 A | 9/2000 | Gievers et al. |

(Continued)

FOREIGN PATENT DOCUMENTS

JP          10-257392          9/1998

(Continued)

OTHER PUBLICATIONS

Hori, Yousuke, Examiner of JPO, Notice of Rejection Ground for Japanese Patent Application for Japanese patent application No. 2004-221094, Nov. 24, 2009.

(Continued)

*Primary Examiner* — Nhan T Tran
(74) *Attorney, Agent, or Firm* — RatnerPrestia

(57) ABSTRACT

A pixel circuit includes a pixel-capture device having a pixel node and operable to convert light intensity into a pixel signal at the pixel node, the pixel signal representing a captured pixel. A row node carries a row signal that is operable to both (a) enable passage of the pixel signal from the pixel node to a column node during a readout phase of the captured pixel, and (b) set the pixel node to a predetermined signal level during a reset phase of the captured pixel. The reset phase and the readout phase are configured to occur during different time intervals. A reset node is included for carrying a reset signal that is operable together with the row signal to (a) enable passage from the pixel node to the column node during the readout phase, and (b) set the pixel node to predetermined signal level during the reset phase.

18 Claims, 4 Drawing Sheets

U.S. PATENT DOCUMENTS

| | | |
|---|---|---|
| 6,128,039 A | 10/2000 | Chen et al. |
| 6,150,676 A | 11/2000 | Sasaki |
| 6,466,266 B1 | 10/2002 | Guidash et al. |
| 6,512,543 B1 * | 1/2003 | Kuroda et al. ............... 348/308 |
| 6,700,611 B1 | 3/2004 | Masuyama |
| 6,798,451 B1 | 9/2004 | Suzuki et al. |
| 6,812,539 B1 * | 11/2004 | Rhodes ..................... 257/435 |
| 6,956,606 B2 | 10/2005 | Mabuchi |
| 7,030,918 B1 | 4/2006 | Nakashiba |
| 7,283,168 B2 | 10/2007 | Watanabe |

FOREIGN PATENT DOCUMENTS

| | | |
|---|---|---|
| JP | 2000-001103 | 7/2000 |
| JP | 2002-051263 | 2/2002 |
| JP | 2002-218307 | 8/2002 |
| JP | 2003-224777 | 8/2003 |

OTHER PUBLICATIONS

H. Tian et al., "Analysis of Temporal Noise in CMOS Photodiode Active Pixel Sensor", IEEE Journal, vol. 36, No. 1, pp. 92-101, Jan. 2001.

B. Pain et al., "Analysis and enhancement of low-light-level performance of photodiode-type CMOS active pixel imagers operated with sub-threshold reset", IEEE Workshop on CCDS and Advanced Image Sensors; 1999.

Hori, Youchei, Examiner Japan Patent Office, "Notice of Rejection Ground" and English translation, Mar. 9, 2010, pp. 1-3.

* cited by examiner

CIRCUIT FOR AN ACTIVE PIXEL

CROSS REFERENCE TO RELATED APPLICATIONS

This application is a Continuation of U.S. application Ser. No. 10/630,647 filed Jul. 29, 2003, now U.S. Pat. No. 7,369,168.

BACKGROUND OF THE INVENTION

Digital cameras and other imaging devices typically have an array of devices, such as pixels arranged on a CMOS microchip for capturing and storing images. Each device and its associated circuitry, the combination of which is often called the Active Pixel Sensor (APS), converts the light intensity detected at each pixel location of the image into a voltage signal that can be digitized for storage, reproduction, and manipulation.

FIG. 1 is a schematic diagram of showing one implementation of a conventional three-transistor APS 100 which digitizes one pixel of an image. The number of pixels in an APS 100 array determines the resolution of the captured image. A typical APS 100 pixel includes three transistors 120, 121, and 122, and a photodiode 125 disposed in a silicon area on top of which are disposed multiple metal layers. Multiple metal layers are typically required because the APS 100 requires five terminal traces for operation. This is because the width between each APS 100 on a conventional CMOS array only typically allows enough space for two terminal traces per metal layer. The five terminal traces include RESET 110, PRESET 111, V.sub.dd 112, COLUMN 113, and ROW 114. Each APS 100 also includes a GROUND 115 terminal. By using a controller (not shown) to control the signals at each of the control terminals for the APS 100 in conjunction with all other contacts associated with other APSs 100 (not shown) in a CMOS array, light intensity striking the CMOS array, i.e., an image, may be detected and digitized.

FIG. 2 is a timing diagram of the conventional operation of the APS 100 of FIG. 1. The operation of the APS 100 includes a reset phase 200, an integration phase 220, and a readout phase 240. Each of these phases 200, 220, and 240 is described below with respect to the timing diagram.

Before an image is acquired, each APS 100 must first be "cleared" during the reset phase 200. This is to make sure that all the pixels in the CMOS array (not shown) have the same starting voltage when the photodiode 125 begins integrating light. During time period 201, the APS 100 is in a previous readout phase 240 and, thus (as is explained below with respect to the readout phase 240), the RESET 110 trace is set to a predetermined low voltage level (typically 0 volts) and the ROW 113 and PRESET 111 traces are set to a predetermined high voltage level (typically 2.5-5.0 volts). At t2, the RESET 110 trace is raised to a high voltage level so that the transistor 121 acts as a closed switch. As such, the voltage at node 130 is equal to the voltage at the PRESET 111 trace. The voltage at node 130 may turn on transistor 122, but any current that may flow through transistor 122 is inconsequential because any resultant signal on the COLUMN 113 trace will not be sensed until the readout phase 240 as described below. Next, the PRESET 111 trace is dropped to a predetermined low voltage level while the RESET 110 trace remains at the high voltage level. Thus, the voltage at node 130 becomes low which causes the parasitic capacitance (not shown) associated with the photodiode 125 to be discharged. Finally, the PRESET 111 trace is brought back to the high voltage level to charge the parasitic capacitance of the photodiode 125 to a predetermined starting voltage level to complete the reset phase 200.

Next, during the integration phase 220, after the photodiode 125 is reset, the RESET 110 trace is set to a low voltage so that the transistor 121 turns off at t3. Now, the photodiode 125 is ready for exposure to light from the image to be captured. During predetermined time period 204, the photodiode 125 is exposed to light. As is known, the photodiode 125 draws a reverse current that is proportional to the intensity of the light that is striking it, and thus, partially or fully discharges the parasitic capacitance.

After the predetermined integration time period 204, the readout phase 240 begins. The ROW 114 trace is brought to a high voltage level at t5 such that the transistor 120 becomes a closed switch and transistor 122 acts as a source follower. This results in the voltage at node 130, which represents the light intensity detected during the integration phase 220, biasing the voltage on the COLUMN 113 trace to this voltage level minus the V.sub.GS drop from the transistor 122. The COLUMN 113 trace is coupled to a constant current source (not shown) such that the voltage at node 130 will translate to a corresponding voltage on the COLUMN 113 trace via transistor 122. Since the voltage threshold of the transistor 122 is or is approximately the same for all transistors 122 in other APSs 100, the effects of the V.sub.GS drops cancel out such that processing circuitry (not shown) determines the intensity of the light at the pixel captured by the APS 100 based on the voltage on the COLUMN 113 trace.

Each phase described above is repeated for each row of APSs 100, i.e., pixels, in a CMOS array during an image capture procedure. Each row is cycled separately and typically done so in a rolling fashion. That is, when the first row transitions from the reset phase to the integration phase the next row begins the reset phase. Therefore, no row of pixels is ever being read while another row of pixels is being read.

One problem with the APSs 100 of FIG. 1 is that each APS 100 requires five terminal traces as described above. As a result, at least three layers of metal, in which the traces (here, two per layer) for each pixel are routed, are typically needed for the CMOS array. These layers of metal are typically disposed on top of the active silicon area in which the integration photodiodes diodes 125 and the transistors 120, 121, and 122 are formed. Furthermore, these metal layers are typically separated by relatively thick layers of dielectric for insulation. Consequently, a conventional CMOS array typically includes at least three layers of metal separated by dielectric.

FIG. 3 is a diagram of an area occupied by an APS 100 in a conventional CMOS array 300. The three layers 310, 311, and 312 of metal separated by oxide insulation 315 create a cavity 320 above each photodiode 125. These cavities 320 can cause two problems. First, the thicker and more numerous the metal and oxide layers, the more light is blocked from reaching the photodiodes 125 in the CMOS array 300. Therefore, as the thickness and number of the metal and oxide layers increases, the sensitivity of the CMOS array 300 decreases.

Second, the higher the cavities 320, the closer the angle of incidence 330 of the incoming light must be to the normal of the CMOS array 300 to reach the pixel as evidenced by the shaded region 325. Therefore, if the angle of incidence 330 is too great, then the photodiodes 125 may not capture the image properly. Furthermore, because of space constraints, a corrective optical train to reduce the angle of incidence may be impractical.

Consequently, it would be desirable to reduce the thickness and/or number of metal and oxide layers in a CMOS pixel array

BRIEF DESCRIPTION OF THE DRAWINGS

The foregoing aspects and many of the attendant advantages of this invention will become more readily appreciated as the same become better understood by reference to the following detailed description, when taken in conjunction with the accompanying drawings, wherein.

DETAILED DESCRIPTION OF THE INVENTION

According to an embodiment of the invention, a pixel circuit includes a silicon substrate having a photodiode that converts light intensity into a voltage signal. The pixel circuit further includes a row trace and a reset trace. The row trace activates a switch for coupling the photodiode to a column trace during readout phase and clears the voltage at the photodiode during a reset phase. The pixel circuit further includes a voltage supply trace. A pixel circuit with only four traces requires fewer metal layers.

By having fewer metal layers (for example, a first metal layer for a row trace and a reset trace, and a second metal layer for column trace and V.sub.dd), light is more readily able to reach the photodiode while an image is being captured. That is, the cavity discussed above for each pixel is less deep because only two layers of metal are present instead of three. Therefore, it is advantageous to have fewer metal layers for the control circuitry associated with each pixel.

Another advantage of having fewer metal layers is the ability to capture light as larger angles of incidence. Because space is limited in applications, such as, for example, digital camera phones, optical correction trains are impractical between the light source and the CMOS pixel array. Thus, the angle of incidence may be wider in a CMOS pixel array having fewer layers of metal as compared to a conventional CMOS pixel array having more layers of metal for control circuitry.

Figure 1:
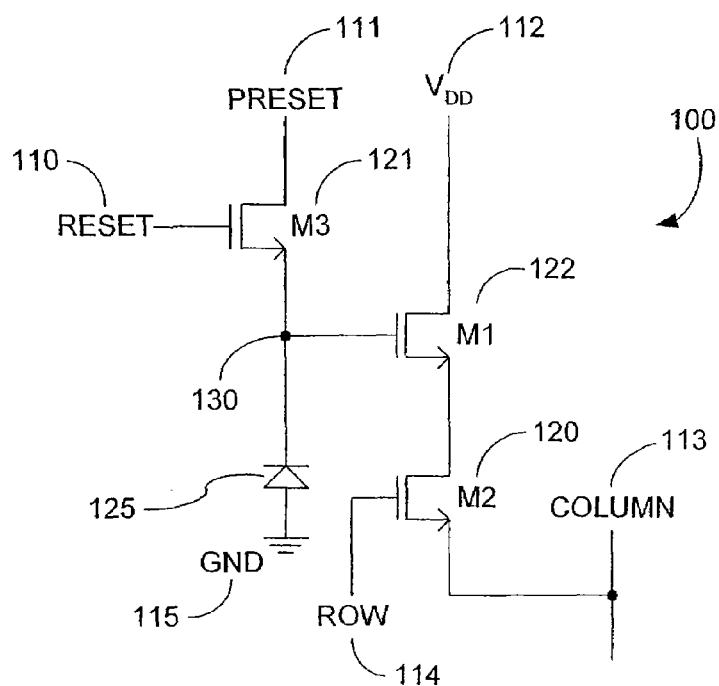
FIG. 1 is a schematic diagram of a conventional three-transistor pixel-capture circuit.
Figure 2:
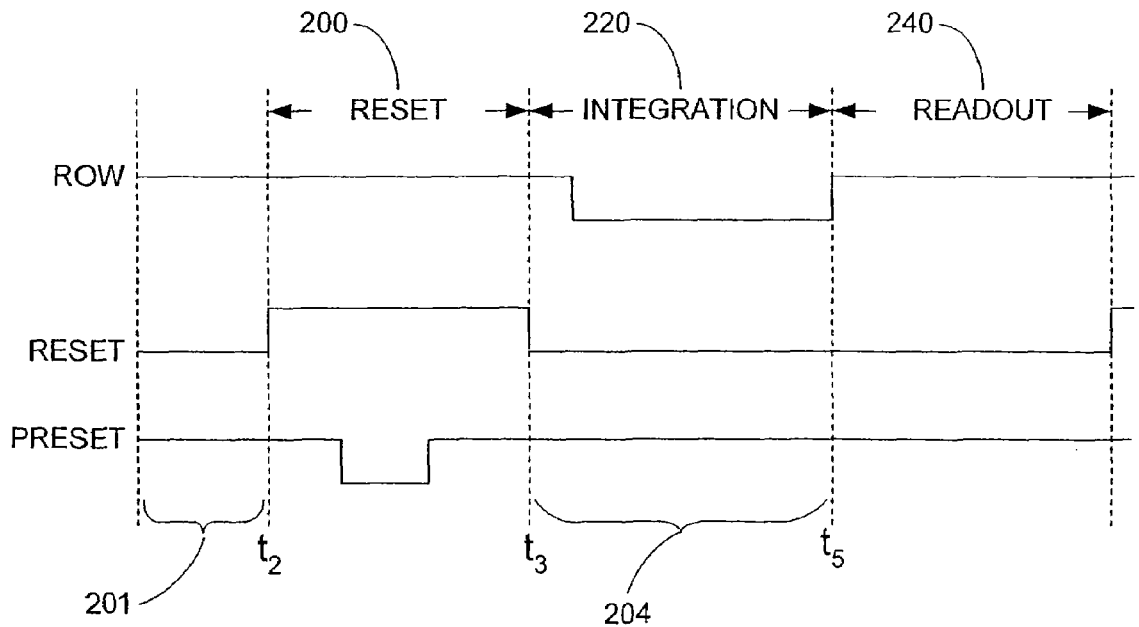
FIG. 2 is a timing diagram that illustrates the operation of the three-transistor pixel-capture circuit of FIG. 1.
Figure 3:
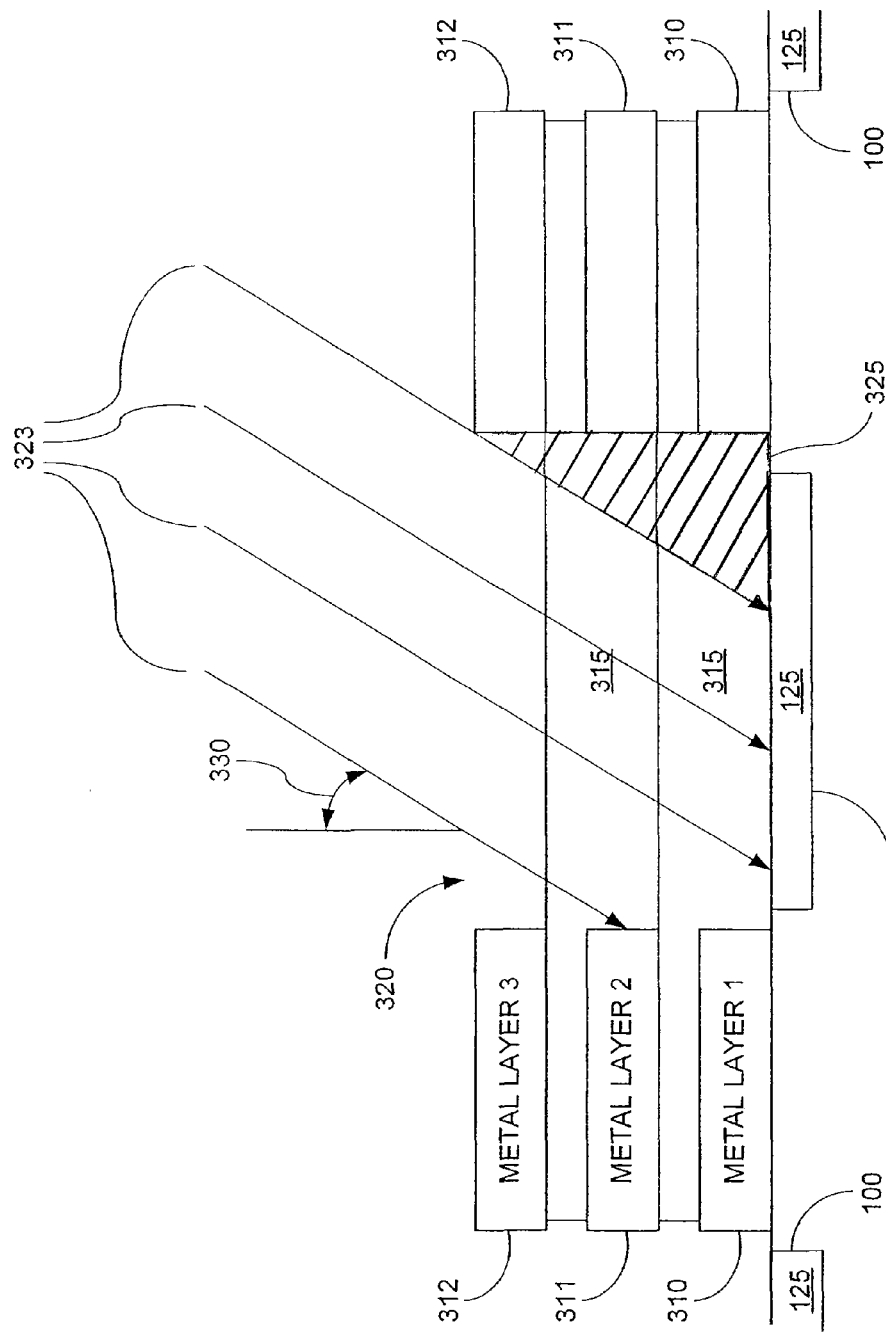
FIG. 3 is a cutaway view of a region of a conventional CMOS pixel array that includes the three-transistor pixel-capture circuit of FIG. 1.
Figure 4:
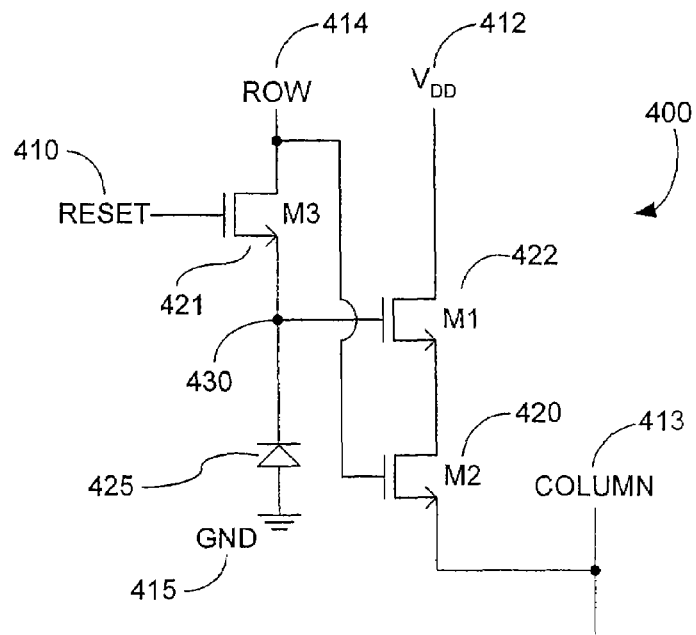
FIG. 4 is a schematic diagram of a three-transistor pixel-capture circuit according to an embodiment of the invention.

FIG. 4 is a schematic diagram of three-transistor APS 400 according to an embodiment of the invention. The APS 400 is similar to the APS 100 of FIG. 1 except that the APS 400 includes only four terminal traces instead of five. This reduction in terminal traces allows a reduction in metal and oxide layers in the corresponding pixel array (FIG. 6) and thus improves the sensitivity of the array.

The APS 400 includes three transistors 420, 421, and 422, and an integration photodiode 425 disposed upon an active silicon area (not shown). However, different from the APS 100 of FIG. 1, only four terminal traces are required for operation. These four traces include RESET 410, V.sub.dd 412, COLUMN 413, and ROW 414. Each APS 400 also includes a GROUND 415 terminal. By having only four traces for each APS 400, fewer metal layers are required for the traces. In the embodiment shown here, the APS 400 eliminates the PRESET 111 trace that was present in the conventional APS 100 shown in FIG. 1. By combining the clearing function of the PRESET 111 trace with the function of the ROW 414 trace, only four traces are used for operation.

Figure 5:
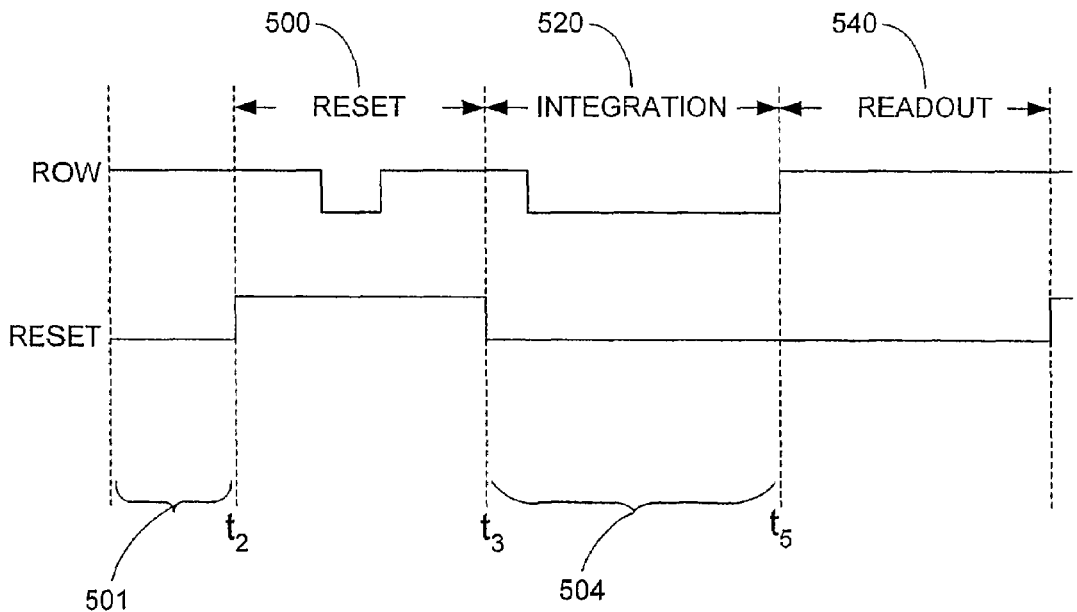
FIG. 5 is a timing diagram of the operation of the three-transistor pixel-capture circuit of FIG. 4 according to an embodiment of the invention.

FIG. 5 is a timing diagram that illustrates the operation of the APS 400 of FIG. 4. The operation of the APS 400 includes a reset phase 500, an integration phase 520, and a readout phase 540. Each of these phases 500, 520, and 540 is described below.

Before an image is acquired, the APS 400 is cleared during the reset phase 500. During time period 501, the APS 400 is in a previous readout phase 540 and, thus, the RESET 510 trace is set to a predetermined low voltage level and the ROW 413 trace is set to a predetermined high voltage level. At t2, the RESET 410 trace is raised to a high voltage level so that the transistor 421 acts as a closed switch such that the voltage at node 430 is equal to the voltage at the ROW 414 trace. The voltage at node 430 may turn on transistor 422, and some current may flow through transistor 422 because the ROW 414 trace, which is also coupled to the gate of transistor 420, is at a high voltage level and the transistor 420 is on. However, since the COLUMN 413 trace is not being accessed, i.e., this is not the readout phase 540, such a voltage on the COLUMN 413 trace typically does not adversely affect the operation of the CMOS array.

Next, the ROW 414 trace is dropped to a predetermined low voltage level while the RESET 410 trace remains at the high voltage level. Thus, the voltage at node 430 becomes low to discharge the photodiode 425. Then, the ROW 414 trace is brought back to the high voltage to charge the parasitic capacitance associated with the photodiode to a predetermined starting voltage level and complete the reset phase 500.

Next, during the integration phase 520, after the parasitic capacitance associated with the photodiode 425 is discharged, the RESET 410 trace is set to a low voltage so that the transistor 421 turns off at t3. Now, the photodiode 425 is exposed to light during predetermined integration period 504.

After the predetermined integration period 504, the readout phase 540 begins. The ROW 414 trace is brought to a high voltage level at t5, such that the transistor 420 is turned on and becomes a closed switch and transistor 422 acts as a source follower. The predetermined high voltage during the readout phase 540 may be the same as during the reset phase, but may vary depending on the current required to turn on transistor 422. This results in the voltage at node 430, which represents the light intensity detected during the integration phase 520, biasing the voltage on the COLUMN 413 terminal minus the V.sub.GS drop from the transistor 422. Again, since the voltage threshold of the transistor 422 is or is approximately the same for all transistors 422 in other APSs 400, the effect of the V.sub.GS drop cancels out such that processing circuitry (not shown) determines the intensity of the light at the pixel based on the voltage on the COLUMN 413 trace.

Each phase described above is repeated for each row of pixels (APSs 400) during an image-capture procedure. Each row is cycled separately and typically done so one after another. That is, after the first row transitions through each of the three above-described phases, the next adjacent row begins with its transition through the phases starting with the reset phase. Therefore, no row of pixels is ever being read while another row of pixels is being read. This is shown in greater detail with respect to FIG. 6, described below.

Figure 6:
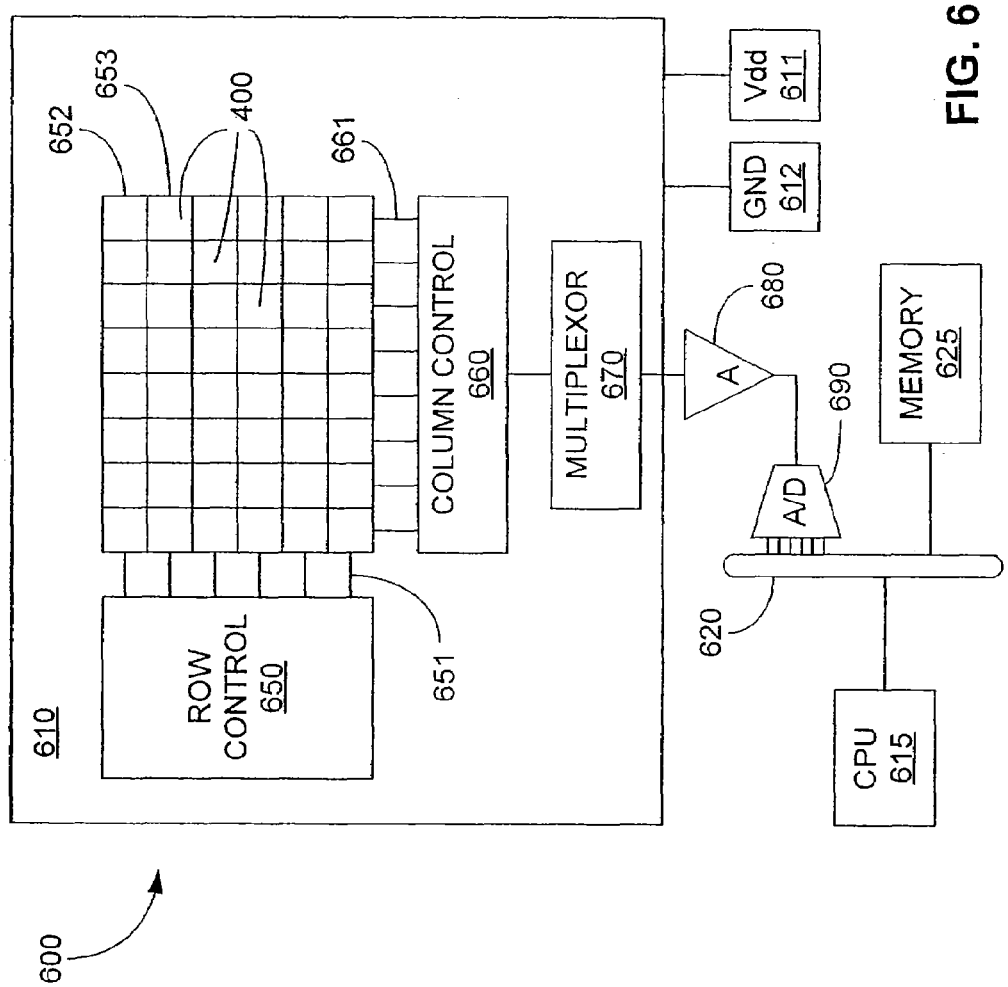
FIG. 6 is a block diagram of a CMOS array that includes the pixel-capture circuit of FIG. 4 according to an embodiment of the invention.

FIG. 6 shows a block diagram of a system 600 that includes a CMOS pixel array 610 having several APSs 400 of FIG. 4, disposed therein. The system 600 may be a digital camera, digital camera-phone, or other electronic device utilizing a digital image-capturing apparatus. The system includes a central processing unit (CPU) 615 coupled with a bus 620. Also coupled with the bus 620 is a memory 625 for storing digital images captured by the CMOS array 610. The CPU 615 facilitates an image capture by controlling the CMOS array 610 through the bus 625 and, once an image is captured, storing of the image in a digital format in the memory 625.

The CMOS array 610 includes several components for facilitating the capture and digitizing of an image. Each APS 400 in the CMOS array 610 is coupled to ROW control circuitry 650 and to COLUMN control circuitry 660 which facilitate the control signals described above with respect to FIGS. 4 and 5. More specifically, each APS 400 in a single row of pixels is coupled to a dedicated ROW (414 of FIG. 4) control line and a dedicated RESET (410 of FIG. 4) control line via connection 651. Additionally, each APS 400 in a single column is coupled to a dedicated COLUMN (413 of FIG. 4) control line via connection 661. Further, each APS 400 in the CMOS array 610 is coupled to V.sub.dd 611 and GROUND 612 (individual connection not shown).

As was described previously with respect to FIG. 5, each row of the CMOS array 610 is read separately. For example, each pixel in the first row 652 starts the image capture procedure, i.e., reset 500, integration 520, and readout 540, prior to the next row 653 starting the same image capture procedure. During the readout phase 540, the voltage on the COLUMN 413 trace at each APS 400 in the first row is read by the column control circuitry 660 and sent to a multiplexor 670. The multiplexor combines each COLUMN 413 trace voltage signal into a single multiplexed signal which represents the voltage signal, i.e., pixel, captured at each photodiode 425 of each pixel in the particular row being read. After an amplification stage 680, this signal is converted into a digital signal via an analog-to-digital converter 690 before being communicated to the bus 620. The CPU 615 then facilitates the storage in the memory 625 of the digital signal in conjunction with the next digital signal representing the next row and so on. This procedure is repeated for each row in the CMOS array 610 until each row has been read and a complete digital image has been stored in the memory 625.

The preceding discussion is presented to enable a person skilled in the art to make and use the invention. The general principles described herein may be applied to embodiments and applications other than those detailed below without departing from the spirit and scope of the present invention. The present invention is not intended to be limited to the embodiments shown, but is to be accorded the widest scope consistent with the principles and features disclosed or suggested herein.

What is claimed:

1. A pixel circuit, comprising
a pixel-capture device having a pixel node and operable to convert light intensity into a pixel signal at the pixel node, the pixel signal representing a captured pixel; and
a row node carrying a row signal that is operable to both (a) enable passage of the pixel signal from the pixel node to a column node during a readout phase of the captured pixel, and (b) set the pixel node to a predetermined signal level during a reset phase of the captured pixel,
wherein the reset phase and the readout phase are configured to occur during different time intervals which are non-overlapping time intervals.

2. The circuit of claim 1, further comprising
a reset node carrying a reset signal that is operable together with the row signal to (a) enable passage from the pixel node to the column node during the readout phase, and (b) set the pixel node to the predetermined signal level during the reset phase.

3. The circuit of claim 2, wherein
the pixel-capture device is disposed on a silicon substrate.

4. The circuit of claim 3, wherein
the row node, the column node, and the reset node are disposed within no more than two conductive layers disposed on the silicon substrate.

5. The circuit of claim 1, wherein
the pixel-capture device comprises a photodiode.

6. The circuit of claim 1, wherein
the pixel signal comprises a voltage.

7. The circuit of claim 1, further comprising
a substrate,
two conductive layers disposed on the substrate, and
one or more conductive paths, respectively, operable to carry the row signal, wherein each of the conductive paths are disposed in a respective one of the two conductive layers.

8. The circuit of claim 7, wherein
only the two conductive layers are disposed on the substrate.

9. A pixel circuit, comprising
a pixel capture-device having a pixel node and operable to convert light intensity into a pixel signal at the pixel node,
a first transistor having a first control node for receiving the pixel signal, a drain node for receiving $V_{DD}$ from a voltage supply, and a first output node for outputting the pixel signal to a second transistor,
the second transistor having a second control node for receiving a row signal from a row node, and a second output node for transferring the pixel signal to a column node, and
a third transistor having a third control node for receiving a reset signal, a drain node for receiving the row signal from the row node, and a third output node for receiving the pixel signal for outputting the pixel signal to the second transistor,
wherein the $V_{DD}$ is separate from the row signal.

10. The circuit of claim 9, wherein
the first, second and third transistors comprise MOSFET transistors.

11. The circuit of claim 9, wherein
the row signal enables the second transistor to transfer the pixel signal to the column node, and
the row signal together with the reset signal enables the third transistor to transfer the pixel signal to the second transistor.

12. The circuit of claim 9, wherein
the reset signal is configured to switch from a high level to a low level, and
the row signal is configured to switch from a low level to a high level, and
when the reset signal is at a high level, and the row signal is at a low level, the pixel-capture device is reset to a predetermined signal level, and
when the reset signal is at a low level, and the row signal is at a high level, the second transistor is enabled to transfer the pixel signal to the column node.

13. The circuit of claim 12, wherein
during a reset phase of the pixel-capture device, the reset signal is configured as a high level and the row signal is configured as a low level, and
during a readout phase of the pixel-capture device, the reset signal is configured as a low level and the row signal is configured as a high level.

14. A CMOS array comprising
a plurality of pixel-capture circuits arranged in rows and columns,
each pixel-capture circuit including a pixel-capture device having a pixel node and operable to convert light intensity into a pixel signal at the pixel node, the pixel signal representing a captured pixel, and
a row node carrying a row signal operable to both (a) transfer the pixel signal at the pixel node to a column trace during a readout phase of the capture-pixel device, and (b) set the pixel node to a predetermined signal level during a reset phase of the capture-pixel device,
wherein the reset phase and the readout phase are configured to occur during different time intervals which are non-overlapping time intervals.

15. The CMOS array of claim 14, wherein
a reset trace carrying a reset signal is operable to prevent transfer of the pixel signal at the pixel node to the column trace during a reset phase of the capture-pixel device.

16. The CMOS array of claim 15, further comprising
a first conductive layer having the row trace and the reset trace disposed therein, and
a second conductive layer having the column trace disposed therein.

17. A system comprising
a CMOS array having a plurality of pixel-capture circuits arranged in rows and columns,
each pixel-capture circuit including a pixel-capture device having a pixel node and operable to convert light intensity into a pixel signal at the pixel node, the pixel signal representing a captured pixel,
a row node carrying a row signal operable to both (a) transfer the pixel signal at the pixel node to a column trace during a readout phase of the capture-pixel device, and (b) set the pixel node to a predetermined signal level during a reset phase of the capture-pixel device, and
a processor operable to facilitate detection of a voltage signal at each column trace in each pixel in the CMOS array, and
wherein the reset phase and the readout phase are configured to occur during different time intervals which are non-overlapping time intervals.

18. The system of claim 17, further comprising
a memory operable to receive and store the pixel signal.

* * * * *